(12) United States Patent
Chang et al.

(10) Patent No.: US 9,859,430 B2
(45) Date of Patent: *Jan. 2, 2018

(54) LOCAL GERMANIUM CONDENSATION FOR SUSPENDED NANOWIRE AND FINFET DEVICES

(71) Applicant: International Business Machines Corporation, Armonk, NY (US)

(72) Inventors: Josephine B. Chang, Bedford Hills, NY (US); Leland Chang, New York, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/755,029

(22) Filed: Jun. 30, 2015

(65) Prior Publication Data

US 2017/0005190 A1     Jan. 5, 2017

(51) Int. Cl.
*H01L 29/78*     (2006.01)
*H01L 29/423*    (2006.01)
(Continued)

(52) U.S. Cl.
CPC ...... *H01L 29/785* (2013.01); *H01L 21/02057* (2013.01); *H01L 21/02532* (2013.01);
(Continued)

(58) Field of Classification Search
CPC ............. H01L 29/785; H01L 29/0649; H01L 29/0673; H01L 29/16; H01L 29/6656;
(Continued)

(56) References Cited

U.S. PATENT DOCUMENTS

| 5,324,683 A | * | 6/1994 | Fitch | .................. G01P 15/0802 148/DIG. 73 |
| 7,601,570 B2 | | 10/2009 | Damlencourt | |

(Continued)

OTHER PUBLICATIONS

Bangsaruntip, et al., "High Performance and Highly Uniform Gate-All-Around Silicon Nanowire MOSFETs with Wire Size Dependent Scaling", pp. 1-4.
(Continued)

*Primary Examiner* — Mohsen Ahmadi
*Assistant Examiner* — Scott Bauman
(74) *Attorney, Agent, or Firm* — Edward J. Wixted, III

(57) ABSTRACT

A semiconductor wafer is provided, where the semiconductor wafer includes a semiconductor substrate and a hard mask layer formed on the semiconductor substrate. Fins are formed in the semiconductor substrate and the hard mask layer. A spacer is formed on an exposed sidewall of the hard mask layer and the semiconductor substrate. The exposed portion of the semiconductor substrate is etched. A silicon-germanium layer is epitaxially formed on the exposed portions of the semiconductor substrate. An annealed silicon-germanium region is formed by a thermal annealing process within the semiconductor substrate adjacent to the silicon-germanium layer. The silicon-germanium region and the silicon-germanium layer are removed. The hard mask layer and the spacer are removed.

10 Claims, 8 Drawing Sheets

(51) Int. Cl.

| | | |
|---|---|---|
| *H01L 29/786* | (2006.01) | |
| *H01L 21/308* | (2006.01) | |
| *H01L 21/324* | (2006.01) | |
| *H01L 21/02* | (2006.01) | |
| *H01L 29/06* | (2006.01) | |
| *H01L 29/16* | (2006.01) | |
| *H01L 29/66* | (2006.01) | |
| *H01L 21/306* | (2006.01) | |

(52) U.S. Cl.
CPC .... *H01L 21/3081* (2013.01); *H01L 21/30604* (2013.01); *H01L 21/324* (2013.01); *H01L 29/0649* (2013.01); *H01L 29/0673* (2013.01); *H01L 29/16* (2013.01); *H01L 29/42392* (2013.01); *H01L 29/6656* (2013.01); *H01L 29/66795* (2013.01); *H01L 29/78696* (2013.01)

(58) Field of Classification Search
CPC ......... H01L 29/66795; H01L 21/02057; H01L 21/02532; H01L 21/30604; H01L 21/3081; H01L 21/324; H01L 29/78696; H01L 29/42392
See application file for complete search history.

(56) References Cited

U.S. PATENT DOCUMENTS

| | | | |
|---|---|---|---|
| 7,659,156 B2 | 2/2010 | Thean et al. | |
| 7,829,916 B2 | 11/2010 | Morand et al. | |
| 8,053,299 B2 | 11/2011 | Xu | |
| 8,159,018 B2* | 4/2012 | Akil | H01L 21/28282 257/324 |
| 8,211,761 B2 | 7/2012 | Tan et al. | |
| 8,349,667 B2 | 1/2013 | Saracco et al. | |
| 8,399,314 B2 | 3/2013 | Cohen et al. | |
| 8,460,990 B2 | 6/2013 | Kim et al. | |
| 9,219,064 B2* | 12/2015 | Kim | H01L 27/092 |
| 9,379,182 B1* | 6/2016 | Chen | H01L 29/0673 |
| 9,496,338 B2* | 11/2016 | Chang | H01L 21/02532 |
| 2007/0190787 A1* | 8/2007 | Loubet | H01L 21/3065 438/689 |
| 2013/0224924 A1* | 8/2013 | Sleight | H01L 29/66477 438/284 |
| 2013/0320455 A1* | 12/2013 | Cappellani | H01L 29/66795 257/368 |
| 2014/0035059 A1* | 2/2014 | Giles | H01L 29/785 257/369 |
| 2015/0076514 A1* | 3/2015 | Morin | H01L 29/7843 257/77 |
| 2015/0140758 A1* | 5/2015 | Huang | H01L 29/66795 438/283 |
| 2016/0268399 A1* | 9/2016 | Akarvardar | H01L 29/66795 |
| 2016/0276432 A1* | 9/2016 | Chang | H01L 21/02532 |
| 2016/0351701 A1* | 12/2016 | Cea | H01L 29/785 |

OTHER PUBLICATIONS

Jiang, et al., "Ge-Rich (70%) SiGe Nanowire MOSFET Fabricated Using Pattern-Dependent Ge-Condensation Technique", IEEE Electron Device Letters, vol. 29, No. 6, Jun. 2008, pp. 595-598.

* cited by examiner

LOCAL GERMANIUM CONDENSATION FOR SUSPENDED NANOWIRE AND FINFET DEVICES

BACKGROUND

The present invention relates generally to suspended semiconductor device structures and in particular to local germanium condensation in device fabrication.

Field effect transistors (FETs) can be semiconductor devices fabricated on a bulk semiconductor substrate or on a silicon-on-insulator (SOI) substrate. FET devices generally consist of a source, a drain, a gate, and a channel between the source and drain. The gate is separated from the channel by a thin insulating layer, typically of silicon oxide, called the gate oxide. A voltage drop generated by the gate across the oxide layer induces a conducting channel between the source and drain thereby controlling the current flow between the source and the drain. Current integrated circuit designs use complementary metal-oxide-semiconductor (CMOS) technology that use complementary and symmetrical pairs of p-type and n-type metal oxide semiconductor field effect transistors (MOSFETs) for logic functions.

The integrated circuit industry is continually reducing the size of the devices, increasing the number of circuits that can be produced on a given substrate or chip. It is also desirable to increase the performance of these circuits, increase the speed, and reduce the power consumption. A three-dimensional chip fabrication approach, such as a finFET, has been developed for semiconductor devices. A finFET is a non-planar FET, generally regarded as a type of suspended channel device. The "fin" is a narrow, vertical silicon base channel between the source and the drain. The fin is covered by the thin gate oxide and bordered on two or three sides by an overlying gate structure. The multiple surfaces of the gate allow for more effective suppression of "off-state" leakage current. The multiple surfaces of the gate also allow enhanced current in the "on" state, also known as drive current. These advantages translate to lower power consumption and enhanced device performance.

In the area of suspended channel device structures, the suspension step is a pivotal point in the process sequence.

SUMMARY

Embodiments of the present invention disclose a method of forming a suspended nanowire and the resulting structure. A semiconductor wafer is provided, where the semiconductor wafer includes a semiconductor substrate and a hard mask layer formed on the semiconductor substrate. Fins are formed in the semiconductor substrate and the hard mask layer. A spacer is formed on an exposed sidewall of the hard mask layer and the semiconductor substrate. The exposed portion of the semiconductor substrate is etched. A silicon-germanium layer is epitaxially formed on the exposed portions of the semiconductor substrate. An annealed silicon-germanium region is formed by a thermal annealing process within the semiconductor substrate adjacent to the silicon-germanium layer. The silicon-germanium region and the silicon-germanium layer are removed. The hard mask layer and the spacer are removed.

DETAILED DESCRIPTION

Figure 1:
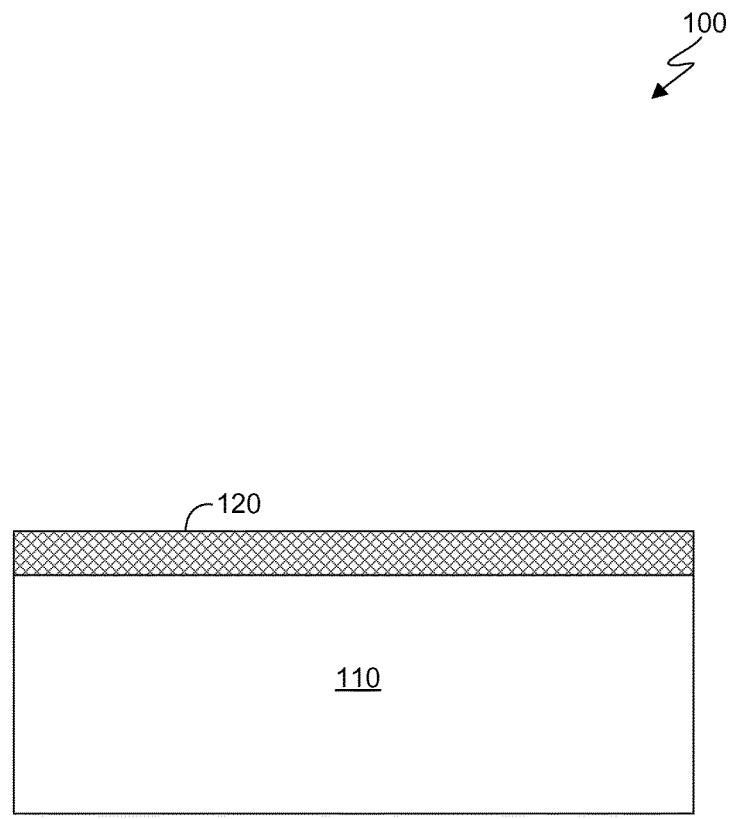
FIG. 1 illustrates a cross-sectional view of a semiconductor wafer including a semiconductor substrate and a hard mask layer in an initial fabrication step, in accordance with an embodiment of the invention.

In several integration flows, the use of an SOI wafer is often proposed, however, this adds to the overall technology cost, so the use of a bulk silicon wafer is often preferred. Several flows for bulk wafers have been considered, but these process flows may often rely on oxidizing a region under the fin or nanowire (a relatively long, thin, conductive region, often caused by a portion of a fin protruding into a gate trench), after the channel is protected by a hard mask layer and spacer, resulting in volumetric expansion of the oxide underneath the channel.

It is a desired aspect of embodiments, in accordance with the present invention, to employ a local germanium condensation process in the fabrication process for a gate-all-around nanowire silicon FET to form a sacrificial release layer. This technique may also be used selectively over various portions of a wafer such that some regions are suspended and other regions are not. In general, germanium (Ge) condensation is a process in which thin Ge layers, having both good quality and high charge carrier mobility, are formed. In one embodiment, a silicon/germanium alloy, epitaxially grown on an SOI substrate, and capped by a thin silicon layer, is thermally annealed in an oxygen-rich environment at a high temperature. The oxidized cap forms a silicon oxide layer, and the overall oxidation process causes germanium atom migration within the alloy, resulting in germanium enrichment of the underlying silicon layer.

Detailed descriptions of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Example embodiments in accordance with the present invention will now be described in detail with reference to the drawing figures.

FIG. 1 illustrates a cross-sectional view of a semiconductor wafer, generally designated 100, in an initial fabrication step, in accordance with an embodiment of the invention. In the depicted embodiment, semiconductor wafer 100 includes semiconductor substrate 110 and hard mask layer 120.

Semiconductor substrate 110 is a semiconductor material, preferably a silicon-containing material including, but not limited to, silicon, silicon germanium alloys, silicon carbon alloys, or silicon germanium carbon alloys. In one embodiment, the nanowire FET structure is built on a bulk silicon wafer which does not include a buried oxide layer (BOX). In other embodiments, semiconductor wafer 100 can include a buried oxide layer composed of a material such as silicon oxide ($SiO_2$) that acts to insulate semiconductor substrate 110 from any additional semiconductor layers formed above the buried oxide layer. The buried oxide layer can be formed by thermally oxidizing the exposed surface of semiconductor substrate 110, or may be deposited onto semiconductor substrate 110 using, for example, chemical vapor deposition (CVD) or atomic layer deposition (ALD). In embodiments where a buried oxide layer is included, a semiconductor layer may be present above the buried oxide layer. In a preferred embodiment, the semiconductor layer is composed of silicon (Si) with a typical thickness of about 5 nm to about 40 nm and preferably about 20 nm. In various embodiments, the semiconductor layer can be composed of any semiconductor material, for example, silicon-containing materials including, but not limited to, silicon germanium alloys, silicon carbon alloys, silicon germanium carbon alloys, or III-V semiconductor materials.

It should be appreciated that embodiments of the invention are not limited to the embodiment depicted in FIG. 1 where semiconductor wafer 100 is a bulk silicon wafer. In other embodiments, semiconductor wafer 100 can be an SOI wafer, and that in these embodiments a buried oxide layer will be present within semiconductor wafer 100.

Any known method of fabricating a semiconductor wafer such as semiconductor wafer 100 can be used in various embodiments of the invention. Additionally, in other embodiments semiconductor wafer 100 may be purchased from a vendor prior to performing the fabrication steps depicted in FIGS. 2-8.

In the depicted embodiment, hard mask layer 120 is formed on the top surface of semiconductor substrate 110. In various embodiments, hard mask layer 120 is composed of, for example, a dielectric material such as silicon nitride, silicon oxide, or a combination of silicon nitride and silicon oxide deposited using, for example, a process such as low pressure chemical vapor deposition (LPCVD), rapid thermal chemical vapor deposition (RTCVD), or plasma-enhanced chemical vapor deposition (PECVD). In general, hard mask layer 120 is a layer of material used to define the shape of fins to be formed in semiconductor substrate 110, and in various embodiments any material which is suitable for use as a hard mask layer can be used. In a preferred embodiment, the material of which hard mask layer 120 is formed has etch selectivity to the material of which semiconductor substrate 110 is formed, thus allowing hard mask layer 120 be removed without removing any portion of semiconductor substrate 110, as described in greater detail below.

Figure 2:
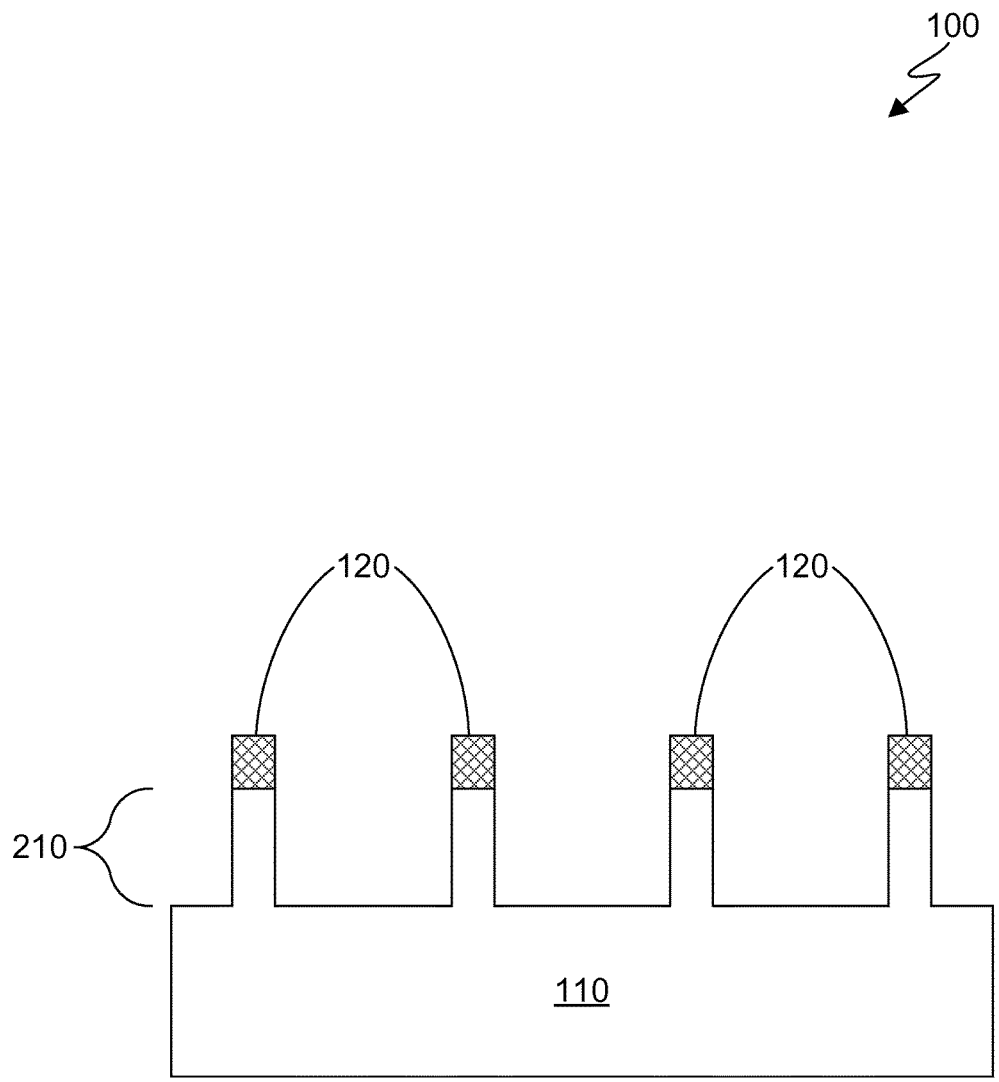
FIG. 2 illustrates a cross-sectional view of the semiconductor wafer of FIG. 1 after the patterning of the hard mask layer and the removal of a portion of the semiconductor substrate to form fins, in accordance with an embodiment of the invention.

FIG. 2 illustrates a cross-sectional view of semiconductor wafer 100 after the patterning of hard mask layer 120 and the removal of a portion of semiconductor substrate 110 to form fins 210, in accordance with an embodiment of the invention.

In various embodiments, standard photolithographic processes are used to define the desired pattern of hard mask layer 120 in a layer of photoresist (not shown) deposited on the top surface of hard mask layer 120. The desired hard mask layer pattern may then be formed in hard mask layer 120 by removing portions of hard mask layer 120 from the areas not protected by the pattern in the photoresist layer. Hard mask layer 120 is removed using, for example, an etch process such as reactive ion etching (RIE). RIE uses chemically reactive plasma, generated by an electromagnetic field, to remove various materials. A person of ordinary skill in the art will recognize that the type of plasma used will depend on the material of which hard mask layer 120 is composed, or that other etch processes such as wet chemical etching or laser ablation may be used.

Similarly, the portions of semiconductor substrate 110 which are exposed, after the patterning of hard mask layer 120, are removed using a second etch process. In the depicted embodiment, the second etch process utilizes the pattern in hard mask layer 120 as an etch mask, such that only the portions of semiconductor substrate not protected by hard mask layer 120 are etched. In a preferred embodiment, the etch process used to remove portions of semiconductor substrate 110 is an anisotropic etch process, where the etch rate in the downward direction is greater than the etch rate in the lateral direction.

Figure 3:
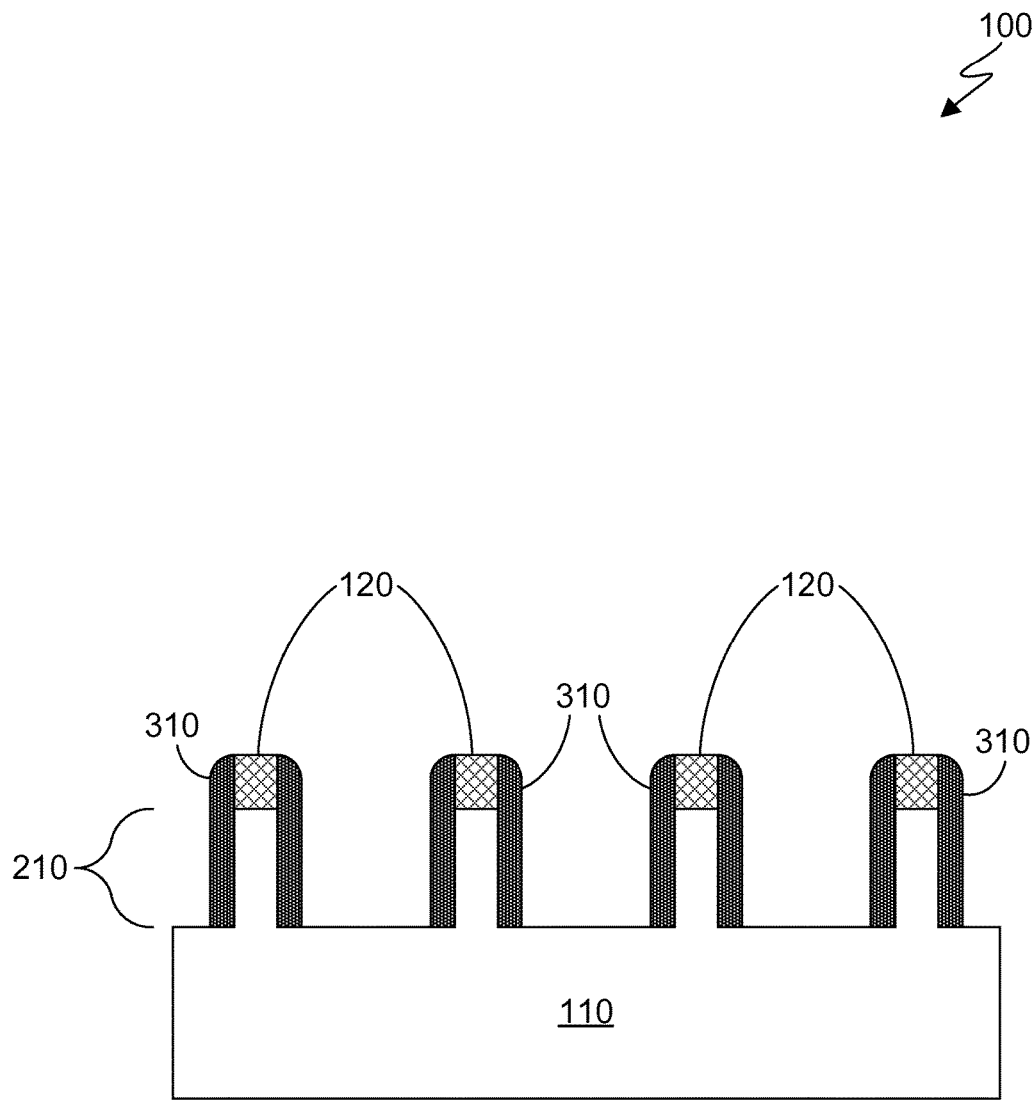
FIG. 3 illustrates a cross-sectional view of the semiconductor wafer after the formation of spacers on the exposed portions of the sides of fins, in accordance with an embodiment of the invention.

FIG. 3 illustrates a cross-sectional view of semiconductor wafer 100 after the formation of spacers 310 on the exposed portions of the sides of fins 210, in accordance with an embodiment of the invention.

For example, forming spacers 310 may include depositing a conformal layer (not shown) of insulating material, such as silicon nitride, over hard mask layer 120 and all of semiconductor substrate 110 including fins 210, such that the thickness of the deposited layer on the sidewalls of fins 210 is substantially the same as the thickness of the deposited layer on the top surface of hard mask layer 120. An anisotropic etch process, where the etch rate in the downward direction is greater than the etch rate in the lateral directions, may be used to remove portions of the insulating layer, thereby forming spacers 310.

Figure 4:
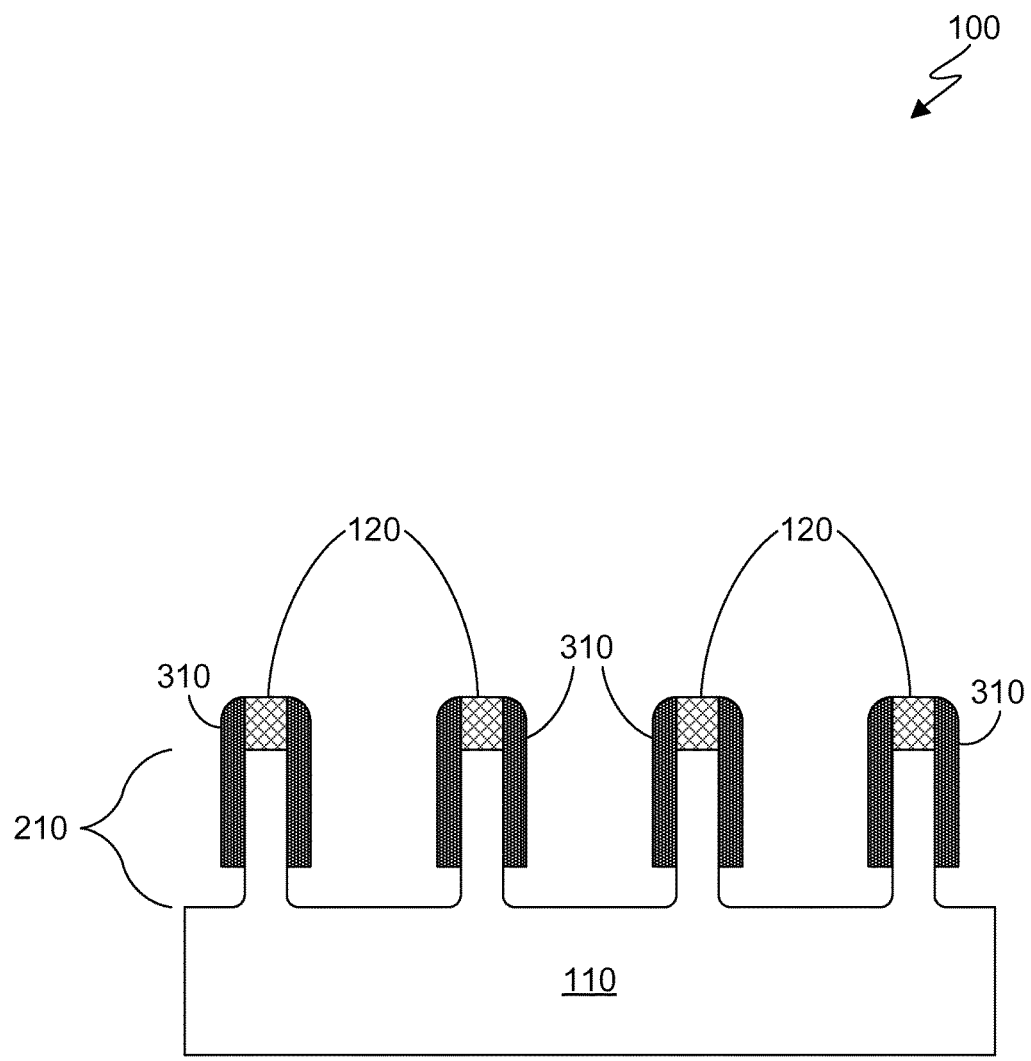
FIG. 4 illustrates a cross-sectional view of the semiconductor wafer after utilizing an etch process to remove the exposed portion of the semiconductor substrate and a portion of the semiconductor substrate present below the spacers, in accordance with an embodiment of the invention.

FIG. 4 illustrates a cross-sectional view of semiconductor wafer 100 after utilizing an isotropic selective etch process to remove the exposed portion of semiconductor substrate 110 and a portion of semiconductor substrate 110 present below spacers 310, in accordance with an embodiment of the invention. In general, the etch process used to remove the desired portion of semiconductor substrate 110 has etch selectivity to the material of which hard mask layer 120 and spacers 310 are formed, such that the desired portion of semiconductor substrate 110 can be removed without removing any portion of hard mask layer 120 or spacers 310. In the depicted embodiment, the etch rate in the lateral direction is depicted as being equal to the etch rate in the downward direction. Further, in the depicted embodiment the amount of semiconductor substrate 110 which is removed is roughly equal to the thickness of spacers 310 formed on the sidewalls of fins 210.

In various embodiments, a selective isotropic etch process such as RIE is used. In embodiments where RIE is used, low bias power is utilized in order to make the etch process more isotropic.

Figure 5:
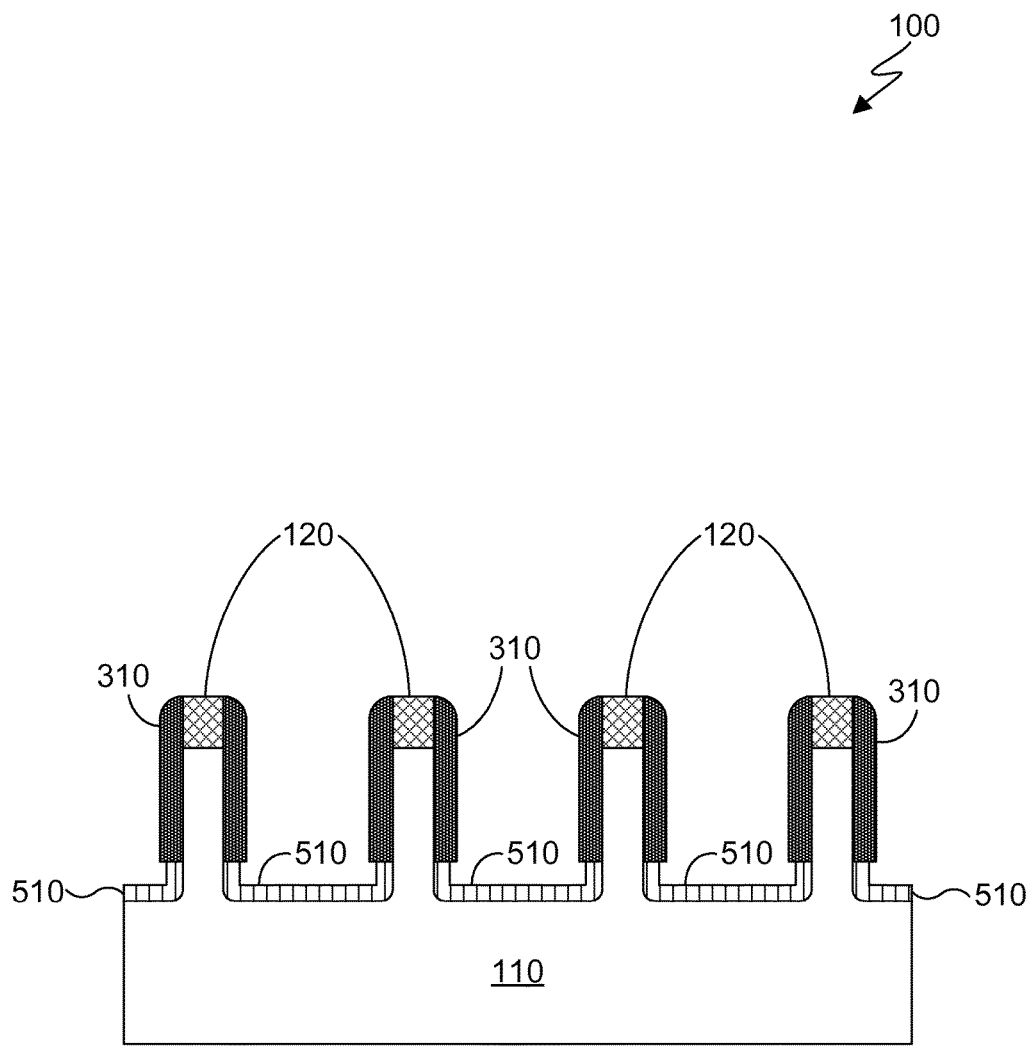
FIG. 5 illustrates a cross-sectional view of semiconductor wafer after the selective epitaxial growth of a silicon-germanium (SiGe) layer on the exposed portions of the semiconductor substrate, in accordance with an embodiment of the invention.

FIG. 5 illustrates a cross-sectional view of semiconductor wafer 100 after the selective epitaxial growth of silicon-germanium (SiGe) layer 510 on the exposed portions of semiconductor substrate 110, in accordance with an embodiment of the invention. In various embodiments, a process such chemical vapor deposition (CVD) or any other known method for epitaxially forming a layer of semiconductor material can be used to form SiGe layer 510.

In one embodiment, SiGe layer 510 is composed of a silicon-germanium alloy including 15 percent germanium or greater. In another embodiment, SiGe layer 510 is composed of pure germanium.

Figure 6:
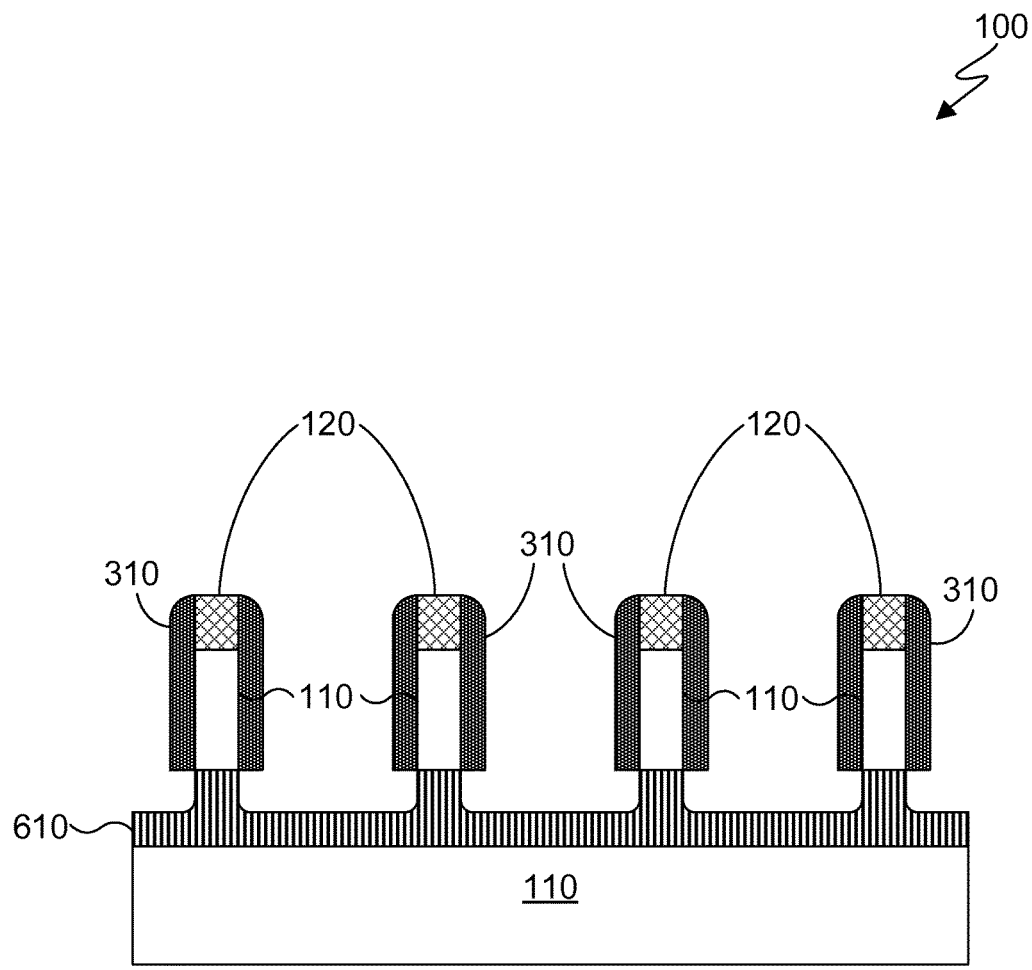
FIG. 6 illustrates a cross-sectional view of the semiconductor wafer after the use of a germanium condensation or thermal mix process to form a SiGe layer, in accordance with an embodiment of the invention.

FIG. 6 illustrates a cross-sectional view of semiconductor wafer 100 after the use of a germanium condensation or thermal mix process to form SiGe layer 610, in accordance with an embodiment of the invention.

A germanium condensation process is a high-temperature thermal annealing process which is performed in an oxidizing environment. In a preferred embodiment, the thermal anneal is performed at a temperature between 1000 degrees Celsius and 1200 degrees Celsius. In one embodiment, the oxidizing environment in which the thermal anneal is performed is composed of an oxidizing agent such as oxygen, nitrous oxide, or water vapor which may be diluted in an inert ambient such as nitrogen or argon. The purpose of the germanium condensation process is to enrich the germanium content of the portion of semiconductor substrate 110 present adjacent to SiGe layer 510 through the migration of germanium atoms from SiGe layer 510 into semiconductor substrate 110, thus forming SiGe layer 610. As a result of the presence of an oxidizing environment, an oxide layer such as silicon oxide ($SiO_2$) forms on the exposed portions of SiGe layer 610.

In general, because germanium is not incorporated into the oxide layer, the germanium is driven into the underlying silicon or silicon-germanium layer to enrich the germanium content of the underlying layer. In embodiments where a germanium condensation process is utilized, the silicon oxide which forms as a result of the germanium condensation process is selectively removed using a process such as a hydrogen fluoride (HF) dip.

A thermal mix process is a high-temperature thermal anneal which is performed in an inert environment, such as a noble gas or nitrogen. Similarly to a germanium condensation process, the high temperature thermal anneal results in the migration of germanium atoms from SiGe layer 510 into the portion of semiconductor substrate 110 located adjacent to SiGe layer 510, thus forming SiGe layer 610. Due to the lack of an oxidizing environment in a thermal mix process, no silicon oxide is formed on the exposed portions of SiGe layer 610.

In a preferred embodiment, after the germanium condensation or thermal mix processing, SiGe layer 610 is composed of roughly 30% Germanium and 70% Silicon. Based on the thicknesses of semiconductor substrate 110, the thickness of SiGe layer 510, and the length and temperate of the germanium condensation or thermal mix process used in various embodiments of the invention, the percentage of germanium within SiGe layer 510 is selected to achieve the desired percentage of germanium present within SiGe layer 610.

In various embodiments of the invention, SiGe layer 610 is a sacrificial release layer which is removed to release the portion of semiconductor substrate 110 present above SiGe layer 610 to form a suspended nanowire.

Figure 7:
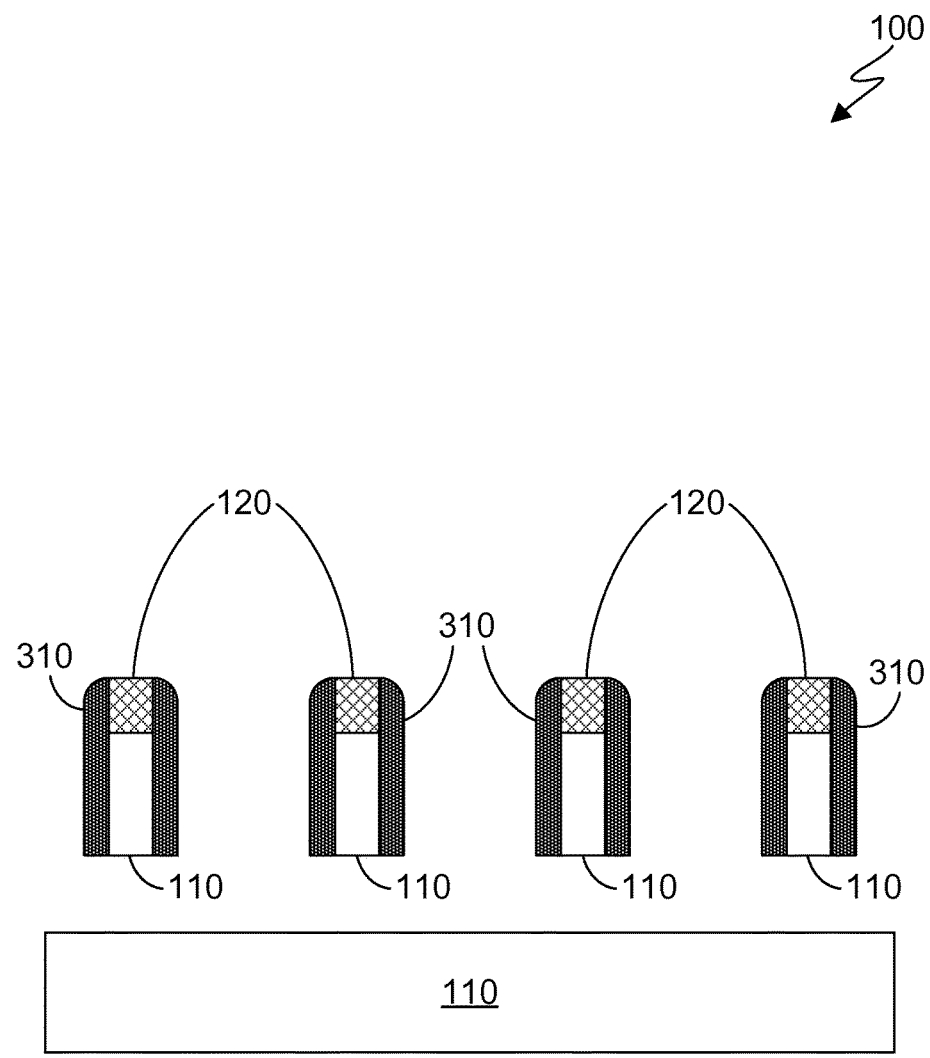
FIG. 7 illustrates a cross-sectional view of the semiconductor wafer after the selective removal of the SiGe layer to form a suspended nanowire, in accordance with an embodiment of the invention.

FIG. 7 illustrates a cross-sectional view of semiconductor wafer 100 after the selective removal of SiGe layer 610 to form suspended nanowire 710, in accordance with an embodiment of the invention. In one embodiment, SiGe layer 610 is removed using a wet etch process such as a standard clean 1 (SC-1) process utilizing ammonium hydroxide and hydrogen peroxide or a chemical vapor etch (CVE) utilizing an etchant such as hydrogen chloride (HCL). In general, any etch process which can selectively remove silicon germanium (SiGe) without removing silicon can be used.

In the depicted embodiment, after the removal of SiGe layer 610, the portion of semiconductor substrate 110 which is now suspended above the rest of semiconductor substrate 110 become nanowires 710. Although in the depicted embodiment SiGe layer 610 is removed prior to the removal of hard mask layer 120 and spacers 310, in other embodiments hard mask layer 120 and spacers 310 are removed prior to the removal of SiGe layer 610, as described in greater detail below.

Additionally, it should be appreciated that after release, the nanowires formed remain rigidly attached to semiconductor wafer 100 by being attached to "pads" of semiconductor material at each of the terminal ends of each nanowire, in accordance with an embodiment of the invention. The process of anchoring a suspended nanowire to a "pad" of semiconductor material is well known in the art, and any known method for attaching a suspended nanowire to a semiconductor wafer can be used in various embodiments of the invention. Further, the appearance that the suspended nanowire is "floating" above the lower portion of the semiconductor substrate is only a result of the section view which is depicted in FIGS. 7 and 8.

Figure 8:
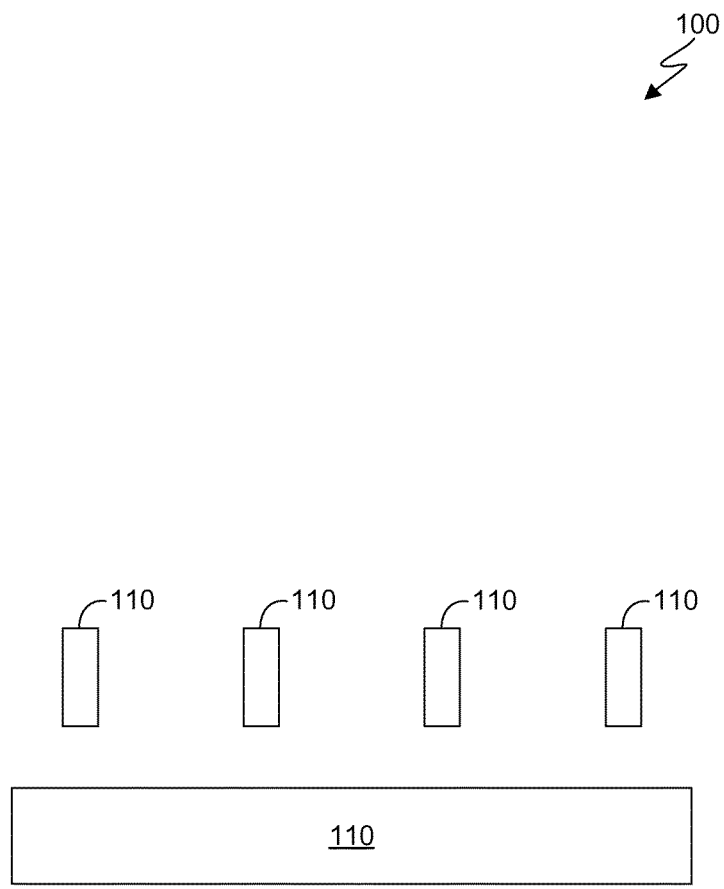
FIG. 8 illustrates a cross-sectional view of the semiconductor wafer after the removal of the hard mask layer and the spacers, in accordance with an embodiment of the invention.

FIG. 8 illustrates a cross-sectional view of semiconductor wafer 100 after removal of hard mask layer 120 and spacer 310, in accordance with an embodiment of the invention.

In some embodiments, hard mask layer 120 and spacers 310 are removed prior to the removal of SiGe layer 610. In general, SiGe layer 610 is removed prior to removing hard mask layer 120 and spacers 310 in embodiments where a gate first process is utilized. Further, in embodiments where hard mask layer 120 and spacers 310 are removed prior to removing SiGe layer 610, a replacement gate process is utilized.

In a gate first process, hard mask layer 120, spacers 310, and SiGe layer 610 are all removed leaving suspended nanowire 710 present above semiconductor substrate 110. After removing hard mask layer 120, spacers 310, and SiGe layer 610, a gate layer is formed around suspended nanowire 710. After the formation of the gate layer, source and drain regions are formed within suspended nanowire 710 adjacent to the gate layer.

In a replacement gate process, hard mask layer 120 and spacers 310 are removed prior to removing SiGe layer 610. After removing hard mask layer 120 and spacers 310, a dummy gate structure is formed which defines the shape and location of the gate terminal of the device while the source and drain regions are formed in suspended nanowire 710. Once the source and drain regions of the device are formed, the dummy gate is removed, SiGe layer 610 is removed, and a metal gate structure is formed around suspended nanowire 710.

It should be appreciated that the processes of producing a nanowire transistor device using either a gate-first process or a replacement gate process are both well known in the art, and that any known method for forming a nanowire transistor device can be used in various embodiments of the invention. Additionally, it should be appreciated that although the embodiment depicted in FIGS. 1-8 illustrate a gate-first process where SiGe layer 610 is removed before hard mask layer 120 and spacers 310 are removed, replacement gate processes where SiGe layer 610 is removed after hard mask layer 120 and spacers 310 are removed can be used in other embodiments of the invention. In general, hard mask layer 120, spacers 310, and SiGe layer 610 can be removed in any order in various embodiments of the invention, and any known method of forming a nanowire transistor device can be used.

The resulting semiconductor device may be included on a semiconductor substrate consisting of many devices and one or more wiring levels to form an integrated circuit chip. The resulting integrated circuit chip(s) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described various embodiments of a local germanium condensation method for forming suspended nanowire and finFET devices (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A method of forming a suspended nanowire, the method comprising:
   providing a semiconductor substrate, wherein the semiconductor substrate includes a semiconductor layer and a hard mask layer formed on the semiconductor layer;
   forming at least one fin in the semiconductor layer and the hard mask layer;
   forming one or more spacers on one or more exposed sidewalls of the at least one fin;
   etching exposed regions of the semiconductor layer;
   subsequent to etching the exposed regions of the semiconductor layer, epitaxially forming a silicon-germanium layer on exposed portions of the semiconductor layer;
   performing a thermal annealing process such that:
      an annealed silicon-germanium region is formed within the semiconductor layer adjacent to the silicon-germanium layer; and
      the annealed silicon-germanium region is a layer between the at least one fin and the semiconductor layer;
   removing the annealed silicon-germanium region and the silicon-germanium layer; and
   removing the hard mask layer and the spacer.

2. The method of claim 1, wherein forming the at least one fin in the semiconductor layer and the hard mask layer comprises removing at least a portion of the hard mask layer and the semiconductor layer.

3. The method of claim 1, wherein etching the exposed regions of the semiconductor layer comprises performing an isotropic etch process on the exposed regions of the semiconductor layer.

4. The method of claim 1, wherein the thermal annealing process is performed in an inert environment.

5. The method of claim 1, wherein the thermal annealing process is performed in an oxidizing environment.

6. The method of claim 1, wherein the silicon-germanium region and the silicon-germanium layer are removed using a chemical vapor etch, wherein the chemical vapor used in the chemical vapor etch comprises hydrogen chloride.

7. The method of claim 1, wherein the silicon-germanium region and the silicon-germanium layer are removed using a standard clean process, wherein the standard clean process utilizes ammonium hydroxide and hydrogen peroxide as etchants.

8. The method of claim 1, wherein the silicon-germanium region comprises at least 15 percent germanium.

9. The method of claim 1, wherein the hard mask layer comprises silicon oxide.

10. The method of claim 1, wherein removing the annealed silicon-germanium region and the silicon germanium layer creates a gap between the at least one fin and the semiconductor layer.

\* \* \* \* \*